United States Patent
Kamada

(10) Patent No.: US 7,294,569 B2
(45) Date of Patent: Nov. 13, 2007

(54) SEMICONDUCTOR DEVICE FABRICATION METHOD AND SEMICONDUCTOR DEVICE FABRICATION SYSTEM FOR MINIMIZING FILM-THICKNESS VARIATIONS

(75) Inventor: Hiroyuki Kamada, Niigata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 141 days.

(21) Appl. No.: 10/868,358

(22) Filed: Jun. 16, 2004

(65) Prior Publication Data

US 2005/0014377 A1  Jan. 20, 2005

(30) Foreign Application Priority Data

Jun. 16, 2003  (JP)  ............... 2003-170737

(51) Int. Cl.
 *H01L 21/302* (2006.01)
(52) U.S. Cl. .................. 438/633; 438/691; 438/692; 257/E21.23
(58) Field of Classification Search ............. 438/633, 438/691–693
See application file for complete search history.

(56) References Cited

U.S. PATENT DOCUMENTS

2002/0096435 A1  7/2002  Matsuda et al.
2004/0063224 A1*  4/2004  Paik ............................ 438/5

FOREIGN PATENT DOCUMENTS

| JP | 2000-232078 | 8/2000 |
| JP | 2002-134466 A | 5/2002 |
| JP | 2003-158108 | 5/2003 |

OTHER PUBLICATIONS

Wolf et al. "Silicon Processing for the VLSI ERA", 1986, vol. 1, pp. 171-174.*
B. Davari et al., "A Variable-Size Shallow Trench Isolation (STI) Technology with Diffused Sidewall Doping for Submicron CMOS", IEDM Tech. Digest, pp. 92-95, 1988.

* cited by examiner

*Primary Examiner*—Thanh Nguyen
(74) *Attorney, Agent, or Firm*—McDermott Will & Emery LLP

(57) ABSTRACT

A polishing-rate distribution of a target film is compared with a desired post-polishing film-thickness distribution of the target film, thereby obtaining a pre-polishing film-thickness distribution of the target film by a reverse calculation, so that film growing conditions can be controlled in advance so as to allow the target film to have, after polishing, a film-thickness distribution that is the same as the desired film-thickness distribution. Therefore, even if there is a possibility that variation in the step height of the wafer surface might be produced by polishing, the finally obtained target film's film-thickness distribution can be the desired film-thickness distribution. Accordingly, semiconductors in which device-to-device variation in characteristic is reduced can be provided.

6 Claims, 8 Drawing Sheets

SEMICONDUCTOR DEVICE FABRICATION METHOD AND SEMICONDUCTOR DEVICE FABRICATION SYSTEM FOR MINIMIZING FILM-THICKNESS VARIATIONS

BACKGROUND OF THE INVENTION

The present invention relates to semiconductor device fabrication methods, and more particularly relates to planarization in semiconductor device fabrication process.

LOCOS (local oxidation of silicon) isolation techniques have been conventionally used to electrically isolate transistors. However, as transistors have been downsized drastically, the LOCOS isolation techniques have met with problems such as decrease in transistor regions due to bird's beaks and hence decrease in the breakdown voltage of transistors surrounded by isolations. In view of this, a technique for isolating devices using shallow trench isolations called STI has been developed as a new device isolation technique (for example, B. Davari et al., IEDM Tech. Digest, 92, (1988).)

In recent years, as the scale of integration of semiconductor devices has been increased, more and more devices and wiring have been downsized and multi-layered. Along with this, problems caused by roughness (step height) on substrate surfaces, which were not so much problematic in the past, have become noticeable. Such problems include, for example, size variation in resist masks formed by patterning of resists in a lithography process, and short circuits in wiring caused in step height portions. Step heights in a substrate surface, as well as, e.g., the performance of a semiconductor device fabrication system (such as an exposure system and an etching system), has a profound effect on size control in forming resist masks, wiring and the like. Therefore, a high degree of planarization of substrate surfaces has been strongly required in recent semiconductor fabrication processes.

In general, chemical mechanical polishing (CMP) is widely used to planarize substrate surfaces. A CMP process, which is used for device isolation, planarization of an insulating film between wires, formation of buried Cu wiring, and various other purposes, is indispensable in fabricating semiconductor devices.

In particular, step heights in a substrate surface due to STIs formed between MIS transistors greatly affect size control in forming gate electrodes of the MIS transistors. Thus, techniques for planarizing substrate surfaces with STIs formed therein have been developed actively for commercial use.

Hereinafter, a conventional technique for planarizing, using a CMP technique, a substrate surface, in which STIs are formed, will be described with reference to FIG. 9.

First, in a step shown in FIG. 9A, a silicon oxide film 2 and a silicon nitride film 3 are formed in sequence on a semiconductor substrate (a silicon substrate in this embodiment) 1. A resist 7 is then applied onto the silicon nitride film 3 and patterned by lithography, thereby forming openings 7a in the resist 7.

Next, in a step shown in FIG. 9B, with the resist 7 used as a mask, a dry-etching process is performed to remove the silicon nitride film 3, the silicon oxide film 2, and the silicon substrate 1 where they are located under the openings 7a, thereby forming trenches 4.

Subsequently, in a step shown in FIG. 9C, a silicon oxide film 5 is formed on the surfaces of the trenches 4, after which an insulating film 6 is formed to completely fill the trenches 4 and cover the silicon nitride film 3. In this step, a TEOS film or a silicon oxide film formed by a CVD process is used as the insulating film 6.

Then, in a step shown in FIG. 9D, the insulating film 6 is annealed and then polished by CMP until the silicon nitride film 3 is exposed. Finally, the silicon nitride film 3 is selectively removed by phosphoric acid, thereby forming STIs 8.

However, in any CMP systems, distribution of polishing rate (hereinafter referred to as polishing-rate distribution) of a target film being polished changes irregularly with time. Such changes with time in the target film's polishing-rate distribution produce in an STI formation process step for example, variations after polishing in the film thickness of a silicon nitride film that is a polishing stopper in CMP between where the silicon nitride film is in the central portion of the wafer and where it is in the peripheral portion thereof. As a result, variations occur in the step height of the device isolation region.

The variations in the step height of the substrate surface then cause variations in the size of gates formed later by lithography, for example. Consequently, semiconductor devices formed in the central and peripheral portions of the wafer might differ in characteristic.

As a method to solve such variations in the step height of a substrate surface resulting from variations in a film-thickness distribution in a wafer, a method is disclosed in Japanese Laid-Open Publication No. 2002-134466. In the method disclosed in the publication, part of a target film having large thickness in a wafer is subjected to a wet-etching process so that the target film is planarized to some extent, after which a planarization process by CMP is performed, thereby decreasing post-polishing variation in the step height of the wafer surface.

SUMMARY OF THE INVENTION

In view of the above circumstances, the present invention was made and an object thereof is to provide semiconductor devices between which variation in characteristic is reduced.

In the above method disclosed in the background of the invention, even if the target film is planarized before the polishing process, variations in the step height of the wafer surface may occur during the polishing process. The above method disclosed in the background of the invention thus has the drawback that the effects of the planarization obtained before the polishing process might be lost.

An inventive method for fabricating a semiconductor device includes the steps of: (a) setting a polishing-rate distribution of a target film formed on a wafer and a desired post-polishing film-thickness distribution of the target film; (b) calculating a pre-polishing film-thickness distribution of the target film based on the polishing-rate distribution and the desired film-thickness distribution; (c) forming the target film having the pre-polishing film-thickness distribution of the target film; and (d) polishing the target film.

In the inventive semiconductor device fabrication method, the polishing-rate distribution of the target film is compared with the desired post-polishing film-thickness distribution of the target film, thereby obtaining a pre-polishing film-thickness distribution of the target film by a reverse calculation, so that film growing conditions can be controlled in advance so as to allow the target film to have, after polishing, a film-thickness distribution that is the same as the desired film-thickness distribution. Therefore, even if there is a possibility that variation in the step height of the wafer surface might be produced by the polishing process, the finally obtained target film's film-thickness distribution can be the desired film-thickness distribution. Accordingly, semiconductor devices in which device-to-device variation in characteristic is reduced can be provided.

The inventive method preferably further includes the steps of: (e) measuring a film-thickness distribution of the target film formed on the wafer, before the step (d) is performed; (f) measuring the film-thickness distribution of the target film, after the step (d) is performed; and (g) updating the polishing-rate distribution based on the film-thickness distribution of the target film obtained in the step (e) and based on the film-thickness distribution of the target film obtained in the step (f), after the step (f) is performed.

Then, the target film's polishing-rate distribution observed in the polishing apparatus can be corrected, such that the film with the desired film-thickness distribution can be formed, even if the polishing-rate distribution irregularly changes with time. Consequently, the polishing process can be performed without being affected by irregular changes with time in the target film's polishing-rate distribution in the polishing apparatus.

In the inventive method, the steps (a) through (g) are preferably repeated.

This enables the target film's polishing-rate distribution in the polishing apparatus to be corrected, such that the film with the desired film-thickness distribution can be formed, even if the polishing-rate distribution irregularly changes with time. Therefore, the wafer with the target film having the desired film-thickness distribution can be stably obtained after the polishing process, without being affected by irregular changes with time in the target film's polishing-rate distribution observed in the polishing apparatus.

In the inventive method, a test wafer is preferably used in the initially performed step (a).

Then, the initial polishing-rate distribution established in the initial step (a) can be updated. Thus, in wafers polished by the second and subsequent routines, the desired film-thickness distribution of the target film can be accurately achieved. Moreover, the actually used wafer with wiring and other patterns formed thereon is not wasted in the first routine.

In the inventive method, the target film may be formed by a plasma CVD process in the step (c).

The inventive method may further include a plurality of steps, before the step (c) is performed.

Then, even a film-thickness distribution that cannot be obtained just by controlling the film-growing process step can be achieved as the pre-polishing film-thickness distribution of the target film.

An inventive semiconductor fabrication system includes: film-forming means which form a target film on a wafer; polishing means which polish the target film; storing means which store a polishing-rate distribution of the target film in the polishing means and a desired post-polishing film-thickness distribution of the target film; and control means which calculate a pre-polishing film-thickness distribution of the target film, based on the polishing-rate distribution of the target film in the polishing means and the desired post-polishing film-thickness distribution of the target film, and which control the film-forming means in such a manner as to realize the pre-polishing film-thickness distribution of the target film.

In the inventive semiconductor fabrication system, the target film's polishing-rate distribution in the polishing means is compared with the target film's desired post-polishing film-thickness distribution, thereby obtaining a pre-polishing film-thickness distribution of the target film by a reverse calculation, so that film growing conditions can be controlled in advance so as to allow the target film to have, after polishing, a film-thickness distribution that is the same as the desired film-thickness distribution. Therefore, even if there is a possibility that variation in the step height of the wafer surface might be produced by polishing, the finally obtained target film's film-thickness distribution can be the desired film-thickness distribution. It is thus possible to provide semiconductor devices in which device-to-device variation in quality is reduced.

In the inventive system, the film-forming means may be a plasma CVD apparatus.

The inventive system preferably further includes film-thickness measuring means which measure a film-thickness distribution of the target film, wherein the storing means controls the film-thickness measuring means in such a manner that the film-thickness measuring means measures pre- and post-polishing film-thickness distributions of the target film, and the storing means updates the polishing-rate distribution of the target film based on the pre- and post-polishing film-thickness distributions of the target film.

Then, the target film's polishing-rate distribution in the polishing means can be corrected, such that the film with the desired film-thickness distribution can be formed, even if the polishing-rate distribution irregularly changes with time. Consequently, the polishing process can be performed without being affected by irregular changes with time in the target film's polishing-rate distribution in the polishing means.

In the inventive system, the film-thickness measuring means preferably has alignment capability.

Then, it is possible to control which part of the wafer is irradiated with a light beam. Conventionally, a measured value of the film thickness of an interlayer dielectric film varied by the thickness of wiring, depending on whether a light beam was incident on the interlayer dielectric film deposited on the wiring or whether the light beam was incident on the interlayer dielectric film deposited in a region in which no wiring was formed. On the other hand, in the present invention, such a problem does not arise, and a measured value does not have an error equivalent to the thickness of wiring. That is, an error in the measured value becomes extremely small.

BRIEF DESCRIPTION OF THE DRAWINGS

FIG. 1A is a schematic view of a polishing apparatus, while

DESCRIPTION OF THE PREFERRED EMBODIMENTS

The following is the present inventors' thinking concerning reasons for the problem with the conventional method that variation is caused in the step height of the wafer surface during the polishing process, such that the effects of the planarization obtained before the polishing process are lost.

First, a polishing process by CMP will be discussed.

Figure 1A:
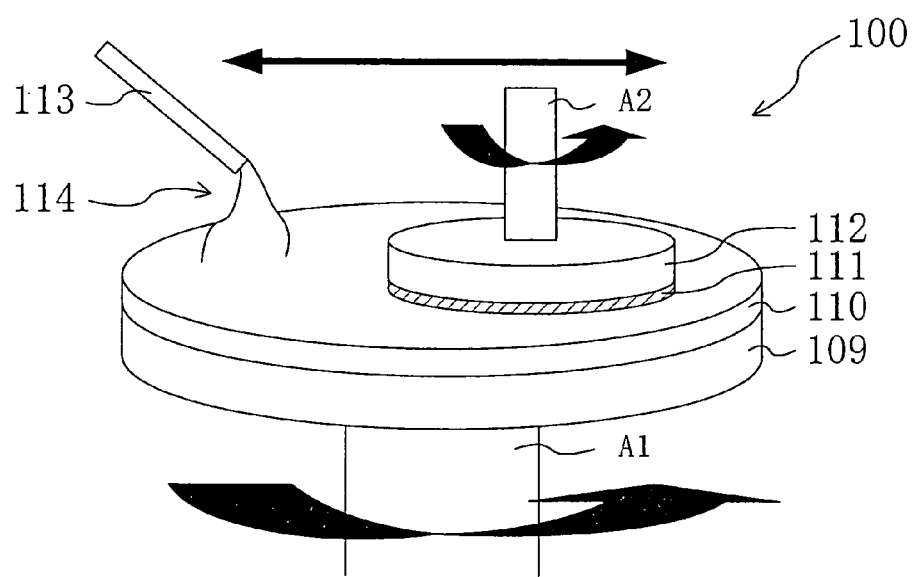

FIG. 1A is a schematic view of a polishing apparatus. The polishing apparatus 100 for performing a CMP process is furnished with a turntable 109, a polishing pad 110 attached onto the turntable 109, a carrier head 112 for holding the wafer to be polished, and a slurry dispenser 113.

The turntable 109 rotates about a rotation spindle A1. The wafer 111 is held by the carrier head 112. In this embodiment, a target film to be polished is formed on the wafer 111. The carrier head 112 has a rotation spindle A2 and rotates about the rotation spindle A2. The rotation spindle A2 presses the wafer 111 against the polishing pad 110 at a predetermined pressure, while the rotation spindle A2 itself performs a reciprocating motion. In this situation, if slurry 114 is supplied onto the polishing pad 110 from the slurry dispenser 113, the slurry 114 enters between the polishing pad 110 and the wafer 111, while spreading over the polishing pad 110. In this way, the target film formed on the wafer 111 is polished. More specifically, the target film can be excellently polished by the synergistic effect of the mechanical polishing made by a relative motion by the polishing pad 110 and the wafer 111 and the chemical effect by the slurry 114.

The present inventors paid attention to the fact that the polishing-rate distribution of the target film changed with time in the planarization process by the CMP technique. Next, mechanisms behind such change with time in the polishing-rate distribution of the target film will be then explained.

Figure 1B:
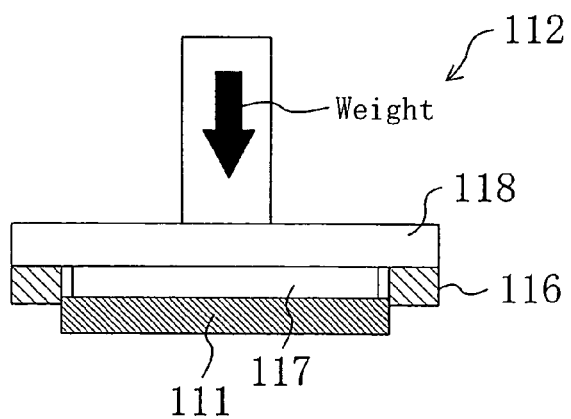
FIG. 1B is an enlarged cross sectional view of a carrier head of the polishing apparatus.

FIG. 1B is a cross sectional view of the carrier head 112 and the wafer 111 of the CMP apparatus during a planarization process by a CMP technique. The wafer 111 is secured to a holder 118 with an elastic wafer-holding seal 117 interposed therebetween. The holder 118 is provided with a retainer ring 116 in order to prevent the wafer from being pressed out when the wafer is pressed against the pad surface and polished. As the planarization procedure proceeds, the elastic wafer-holding seal 117, which is always weighed by the carrier head 112, decreases in thickness with time, thereby reducing part of the wafer 111 which protrudes from the carrier head 112. However, the wafer-holding seal 117 returns to its original thickness, if it is left to stand without performing any polishing. In this way, the protruding part of the wafer 111 from the lower surface of the retainer ring 116 always changes in size over time. As a result, the polishing-rate distribution of the target film varies irregularly over time.

Figure 2:
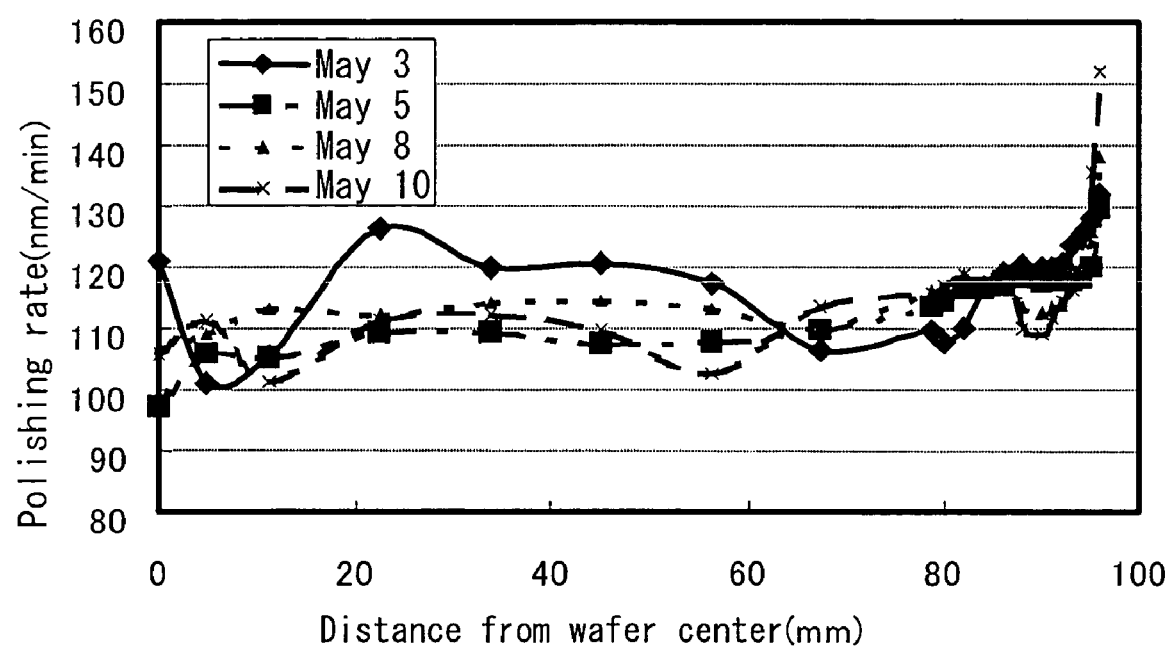
FIG. 2 indicates target-film's polishing-rate distributions obtained when a wafer with an oxide film formed as a target film is polished under the same conditions on different days.

FIG. 2 indicates target-film's polishing-rate distributions obtained when a wafer with an oxide film formed as a target film is polished under the same conditions on different days.

As explained above, it can be seen that the target film's polishing-rate distribution varies irregularly from day to day.

In addition, if the same carrier head is continued to be used, the retainer ring will be in contact with the polishing pad at some point in time. The carrier head thus needs replacement at given periods. However, assembly of the carrier head is manually performed by workers, which produces small variation in the carrier head assembly as well. Such variation then leads to change in the size of the protruding part of the wafer 111 from the carrier head 112 shown in FIG. 1B. Consequently, the polishing-rate distribution of the target film varies irregularly over time in the CMP apparatus, even if the polishing is performed under the same conditions with respect to, for example, pressure at which the carrier head 112 presses the wafer 111 against the polishing pad 110, and the rotational speed of the turntable 109 and carrier head 112.

Considering the above, the present invention was made. Hereinafter, embodiments of the present invention will be described with reference to the accompanying drawings.

Figure 3:
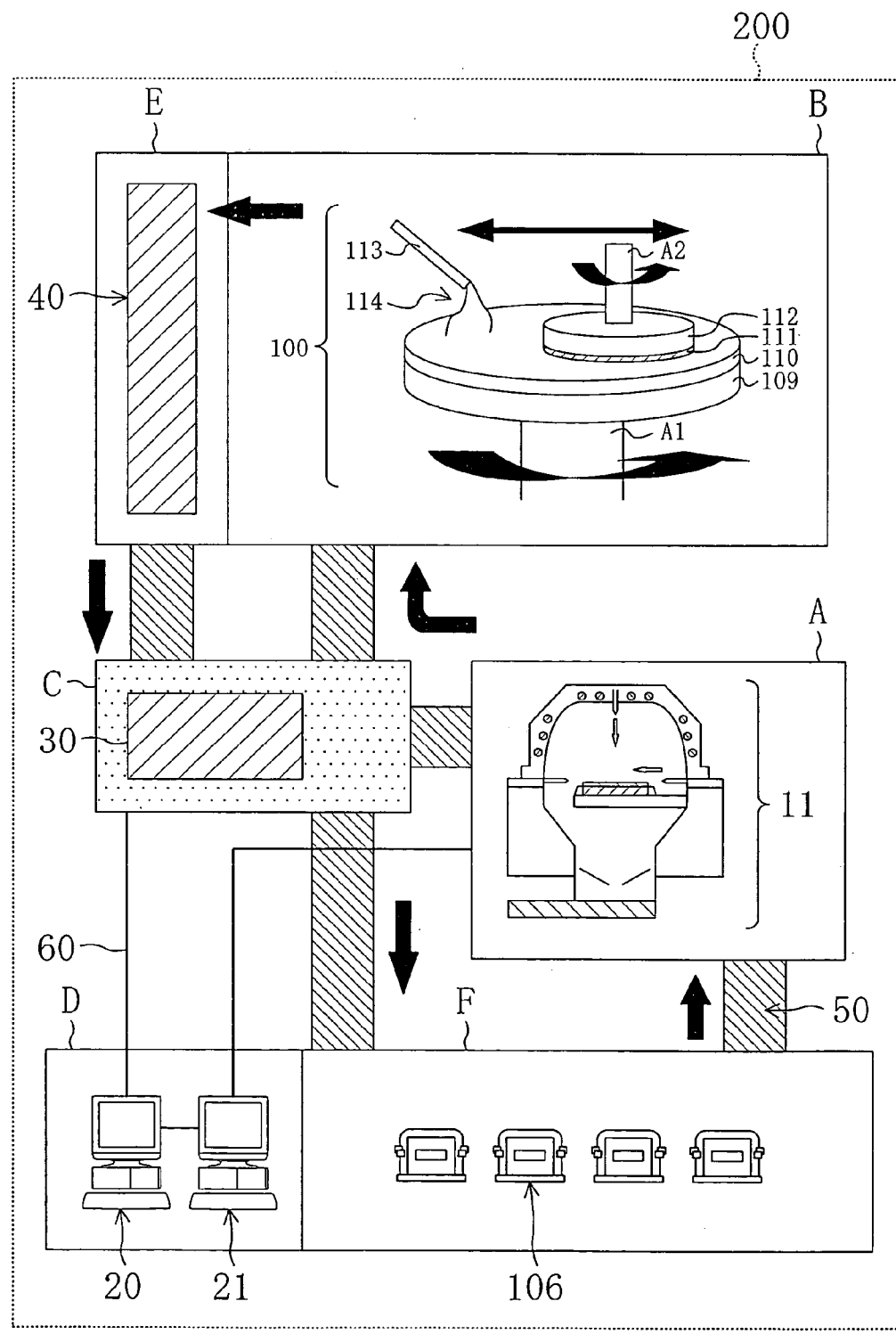
FIG. 3 illustrates the configuration of a semiconductor fabrication system.

With reference to FIG. 3, an embodiment of the present invention will be described. FIG. 3 illustrates the configuration of a semiconductor fabrication system 200 of this embodiment.

As shown in FIG. 3, the semiconductor fabrication system 200 of this embodiment is composed of a film growing block A for growing a target film, a polishing block B, a film thickness measurement block C, a computation block D, a cleaning block E, and a wafer keeping block F. Those blocks are connected with each other via wafer transfer lines 50 along which wafers can travel back and forth.

A film growing apparatus 11 is placed in the film growing block A. A polishing apparatus 100 illustrated in FIG. 1A is installed in the polishing block B. An optical film thickness measurement apparatus 30 is provided in the film thickness measurement block C. The optical film thickness measurement apparatus 30 is vibration proof so as not to be affected by vibration during polishing.

In the computation block D, a computer 20 for performing various operations and a computer 21 for controlling the film growing apparatus 11 placed in the film growing block A are provided.

A cleaning apparatus 40 is installed in the cleaning block E, while a wafer cassette 106 for keeping therein a number of wafers that require treatment is placed in the wafer keeping block F.

A network cable 60 establishes connection between the optical film thickness measurement apparatus 30 and the computer 20, between the computer 20 and the computer 21, and between the computer 21 and the film growing apparatus 11. Data on a polishing-rate distribution of a target film in the polishing apparatus 100 and data on a desired post-polishing film-thickness distribution of the target film are stored beforehand in a memory in the computer 20.

Next, it will be described how the semiconductor fabrication system 200 of this embodiment operates.

First, in the computation block D, the computer 20 calculates an optimum pre-polishing film-thickness distribution of the target film from the polishing-rate distribution and the desired post-polishing film-thickness distribution of the target film, which have been stored in advance. The computer 20 then sends the calculation results to the computer 21 that controls the film growing apparatus 11.

Next, a wafer taken out of the wafer cassette 106 is transferred to the film growing block A, and the computer 21 establishes conditions for growing the target film so that the optimum pre-polishing film-thickness distribution of the target film can be achieved. The film growing apparatus 11 performs a film growing process under the established conditions.

The wafer, which has been subjected to the film growing process, is transferred to the measurement block C, where the optical film thickness measurement apparatus 30 measures the pre-polishing film-thickness distribution of the target film. The measurement results are sent to the computer 20 that performs various operations and stored in the memory in the computer 20.

Subsequently, the wafer is transferred to the polishing block B, where the polishing apparatus 100 polishes the wafer. After the polishing, the wafer is transferred to the cleaning block E, where the cleaning apparatus 40 removes the slurry on the upper and bottom faces.

Next, the wafer is transferred to the measurement block C, where the post-polishing film-thickness distribution of the target film is measured. The measurement results are sent via the network to the computer 20 that performs various operations and stored in the memory in the computer 20.

Finally, the wafer returns to the wafer cassette 106 from which it was taken out, and the process ends. At this time, in the computation block D, the computer 20 calculates the newest polishing-rate distribution of the target film in the polishing apparatus 100, from the data on the pre- and post-polishing film-thickness distributions of the target film and from the polishing time, and then updates the target film's polishing-rate distribution data stored beforehand to the newest data.

Figure 4:
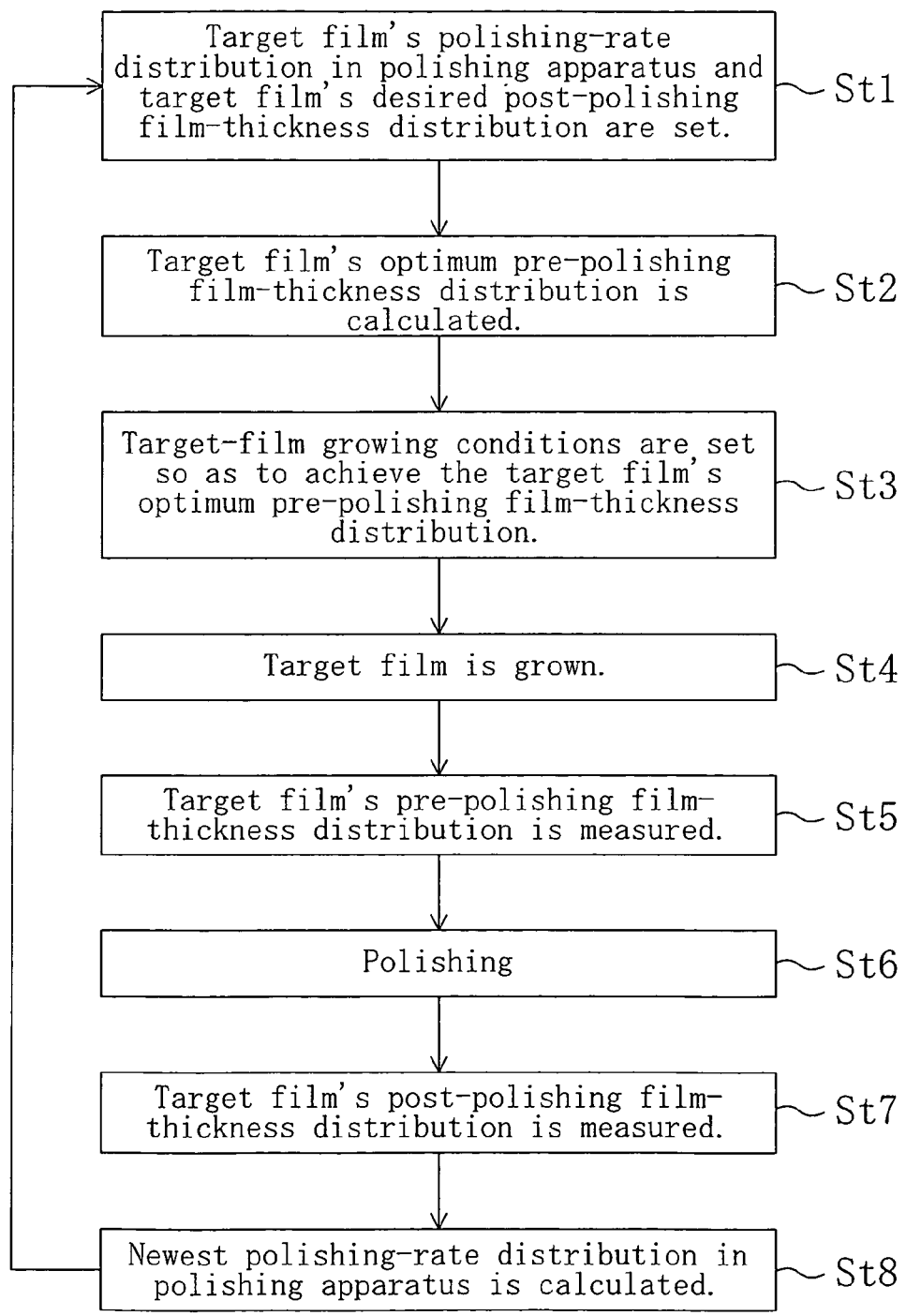
FIG. 4 is a flow chart illustrating a semiconductor device fabrication method.
Figure 5A:
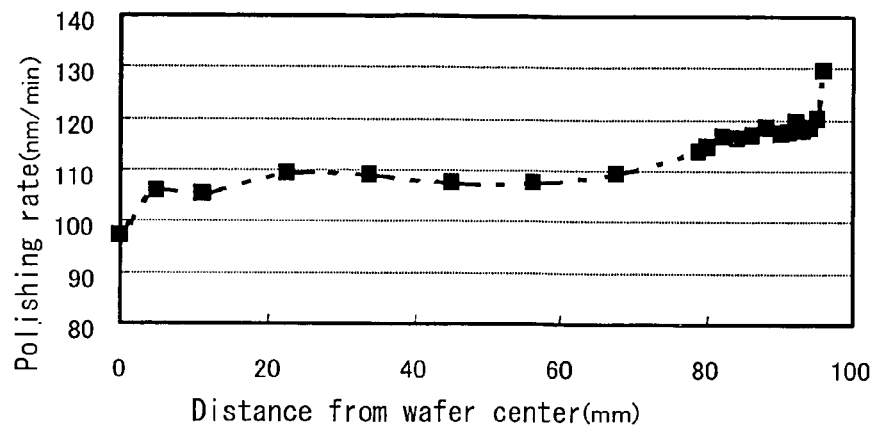
FIG. 5A indicates a polishing-rate distribution of a target film in a polishing apparatus 100.
Figure 5B:
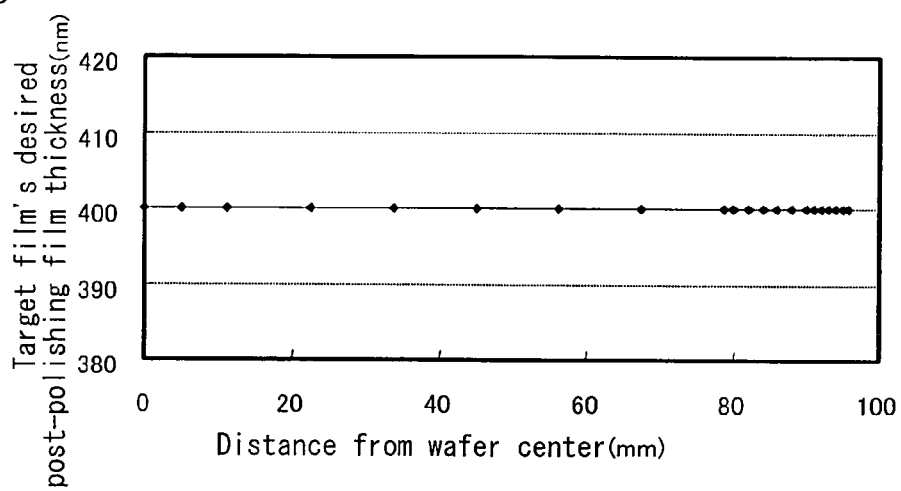
FIG. 5B indicates a desired post-polishing film-thickness distribution of the target film.
Figure 5C:
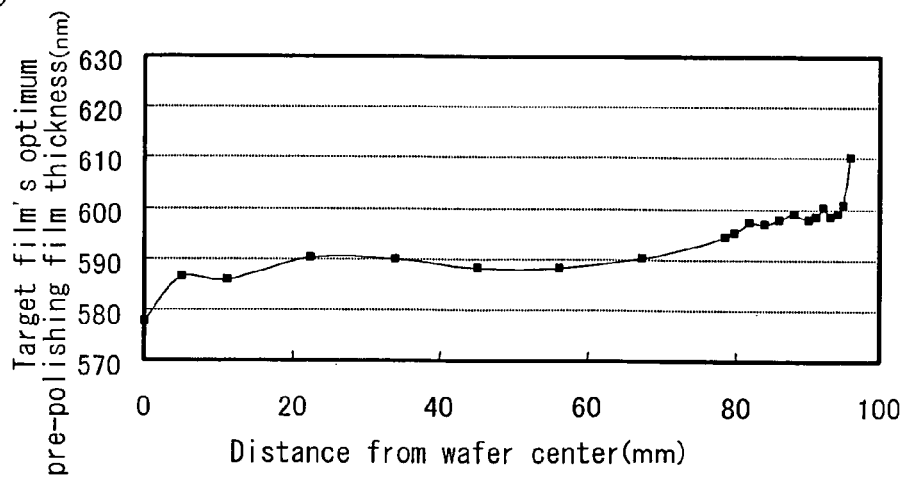
FIG. 5C indicates an optimum pre-polishing film-thickness distribution of the target film which is calculated from the target film's polishing-rate distribution in the polishing apparatus 100 and the target film's desired post-polishing film-thickness distribution.

Now, with reference to FIGS. 3 through 5, it will be described how a semiconductor device is fabricated by the semiconductor fabrication system 200 of this embodiment. FIG. 4 is a flow chart illustrating a semiconductor device fabrication method of this embodiment. FIG. 5A indicates a polishing-rate distribution of a target film in the polishing apparatus 100. FIG. 5B indicates a desired post-polishing film-thickness distribution of the target film. FIG. 5C indicates an optimum pre-polishing film-thickness distribution of the target film. The optimum pre-polishing film-thickness distribution is calculated from the target film's polishing-rate distribution in the polishing apparatus 100 and the target film's desired post-polishing film-thickness distribution.

First, as shown in FIG. 4, in a step St1, a polishing-rate distribution, in the polishing apparatus 100, of a target film to be grown on the wafer 111, and a desired post-polishing film-thickness distribution of the target film are set in the computer 20. In this embodiment, the data shown in FIG. 5A is set as the target film's polishing-rate distribution in the polishing apparatus 100, and the data shown in FIG. 5B is established as the target film's desired post-polishing film-thickness distribution. Initial data on the target film's polishing-rate distribution in the polishing apparatus 100 and initial data on the target film's desired post-polishing film-thickness distribution are set in advance in the computer 20 as system control data after maintenance or start-up of the system.

Then, as shown in FIG. 4, in a step St2, the computer 20 calculates an optimum pre-polishing film-thickness distribution of the target film, based on the target film's polishing-rate distribution in the polishing apparatus 100 and the target film's desired post-polishing film-thickness distribution that have been already set. More specifically, as shown in FIG. 5C, from the data sets shown in FIGS. 5A and 5B, film-thickness distribution data is obtained, in which the target film's pre-polishing film thickness is increased with distance from the central portion of the wafer.

Subsequently, as shown in FIG. 4, in a step St3, the data on the optimum pre-polishing film-thickness distribution of the target film is sent from the computer 20 to the computer 21 that controls the film growing apparatus 11 that grows the target film. The computer 21 sets conditions for growing the target film in such a manner as to achieve the target film's optimum pre-polishing film-thickness distribution.

Then, as shown in FIG. 4, in a step St4, the film growing apparatus 11 performs a film growing process under the established conditions.

Next, as shown in FIG. 4, in a step St5, the pre-polishing film-thickness distribution of the target film grown on the wafer 111 is measured using the optical film thickness measurement apparatus 30, and the measurement results are inputted to the computer 20.

Next, as shown in FIG. 4, in a step St6, the polishing apparatus 100 polishes the wafer 111.

Subsequently, as shown in FIG. 4, in a step St7, the post-polishing film-thickness distribution of the target film on the wafer 111 is measured using the optical film thickness measurement apparatus 30, and the measurement results are inputted to the computer 20.

Then, as shown in FIG. 4, in a step St8, the computer 20 calculates the newest polishing-rate distribution in the polishing apparatus 100, from the difference between the target film's pre-polishing film-thickness distribution obtained in the step St5 and the target film's post-polishing film-thickness distribution obtained in the step St7.

Next, as shown in FIG. 4, the process returns to the step St1, and the polishing-rate distribution in the polishing apparatus 100, which has been set in the computer 20, is updated to the newest polishing-rate distribution.

By repeating the above steps St1 through St8, wafers with the target film that has the desired film-thickness distribution after the polishing process can be obtained.

In the semiconductor device fabrication method of this embodiment, the polishing-rate distribution in the polishing apparatus is compared with the desired post-polishing film-thickness distribution of the target film, thereby obtaining the optimum pre-polishing film-thickness distribution of the target film by a reverse calculation, so that film growing conditions are controlled in advance so as to allow the target film to have, after polishing, a film-thickness distribution that is the same as the desired film-thickness distribution. Therefore, even if there is a possibility that variation in the step height of the wafer surface might be produced by polishing, the finally obtained film-thickness distribution of the target film is the desired film-thickness distribution. It is thus possible to provide semiconductor devices in which device-to-device variation in quality is reduced.

Furthermore, in the semiconductor device fabrication method of this embodiment, since the target film's polishing-rate distribution observed in the polishing apparatus can be corrected, the film with the desired film-thickness distribution can be formed, even if the polishing-rate distribution irregularly changes over time. Consequently, the polishing process can be performed without being affected by irregular changes with time in the target film's polishing-rate distribution in the polishing apparatus.

In particular, once film growing conditions have been established, irregular changes with time hardly occur in the film growing process, which provides the advantage that the desired pre-polishing film-thickness distribution can be stably obtained.

Moreover, in this embodiment, the wafer 111 is polished in the step St6, and the film thickness is measured in the steps St5 and St7. This means that the film thickness is not measured during the polishing process. The wafer thus can be held still when the film thickness is measured. It is therefore possible to control which part of the wafer is irradiated with a light beam radiated from the light source of the optical film thickness measurement apparatus 30.

When an interlayer dielectric film is polished in a wiring formation process step, a measured value of the film thickness of the interlayer dielectric film varies by the thickness of the wiring, depending on whether a light beam is incident on the interlayer dielectric film deposited on the wiring or whether the light beam is incident on the interlayer dielectric film deposited in a region in which no wiring is formed. However, in the present invention, since it is possible to control which part of the wafer is irradiated with the light beam, the measured value does not have an error which is equivalent to the thickness of the wiring. That is, an error in the measured value is extremely small. Accordingly, the method of this embodiment is very suitable for cases in which accurate film thickness control is required. Therefore, the optical film thickness measurement apparatus 30 preferably has alignment capability in cases where a film-thickness distribution of a target film on a wafer having wiring and other patterns formed thereon is measured.

In addition, the polishing-rate distribution is fed back from the step St8 to the step St1 and always updated. This enables the target film's polishing-rate distribution observed in the polishing apparatus to be corrected, such that the film with the desired film-thickness distribution can be formed, even if the polishing-rate distribution irregularly changes over time. Accordingly, the wafer with the target film having the desired film-thickness distribution after polishing can be stably obtained without being affected by irregular changes with time in the polishing-rate distribution of the target film. Moreover, since environmental factors of the polishing apparatus are not changed, the CMP process can be stabilized.

The film growing apparatus 11 placed in the film growing block A of the semiconductor fabrication system of this embodiment is preferably a film growing apparatus which performs a plasma CVD process in which the shape of film-thickness distribution can be relatively easily controlled by a gas flow or plasma distribution. In that case, nevertheless, an electromagnetic wave might affect other instruments, so a partition for preventing electromagnetic-wave emission from the film growing block A has to be provided.

Figure 6:
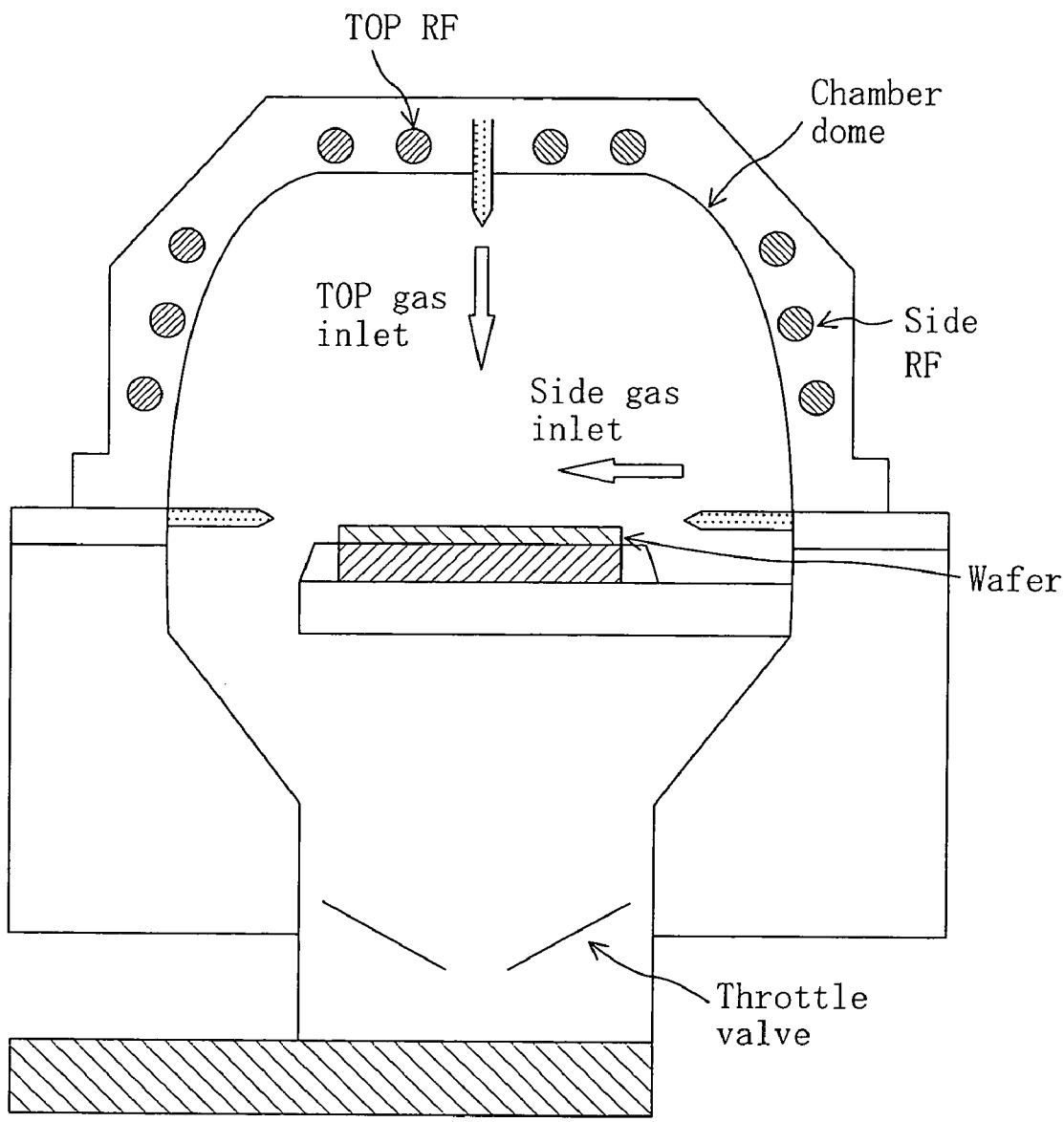
FIG. 6 illustrates a plasma CVD apparatus used in the present invention.
Figure 7:
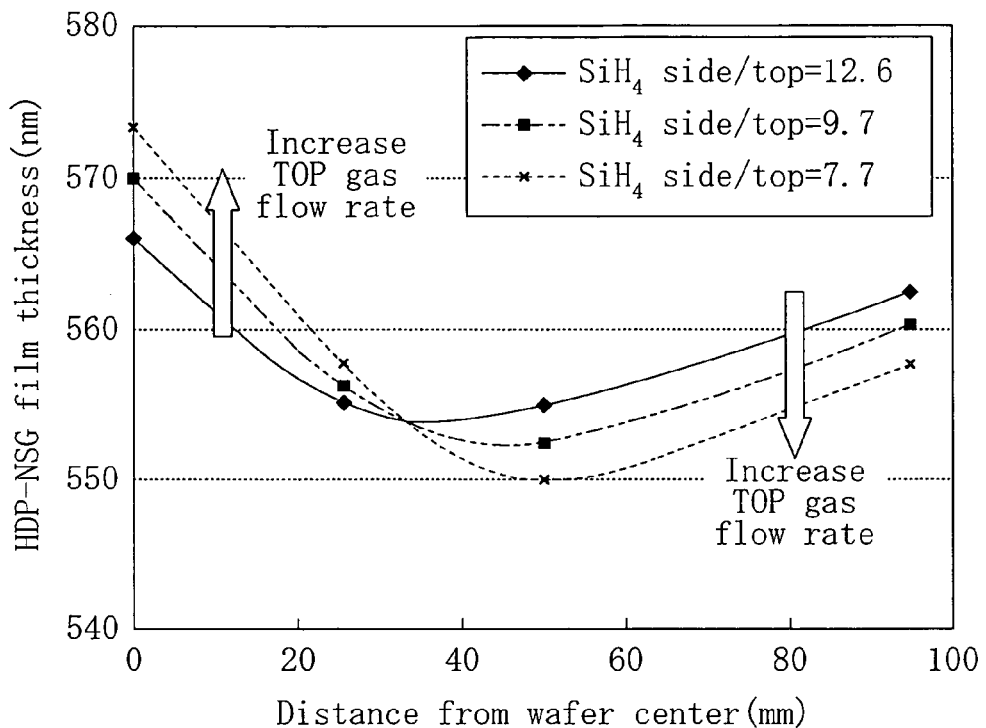
FIG. 7 indicates correlation between a gas flow rate ratio and a film-thickness distribution of a target film grown on a wafer in a film-growing process step.
Figure 8:
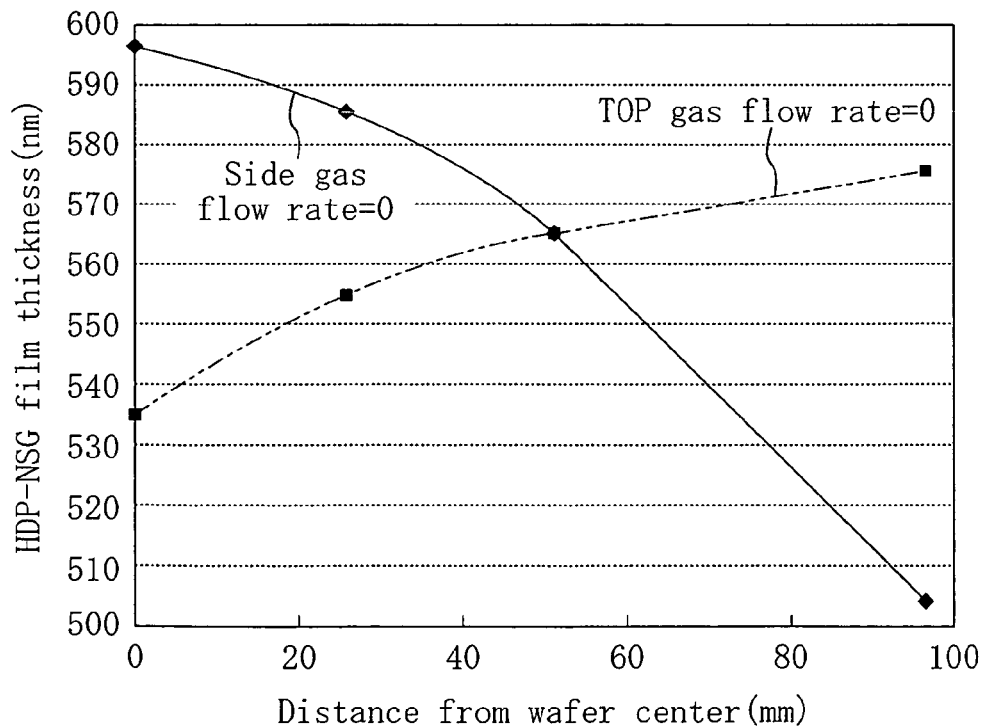
FIG. 8 indicates correlation between a gas flow rate ratio and a film-thickness distribution of a target film grown on a wafer in a film-growing process step.
Figure 9A:
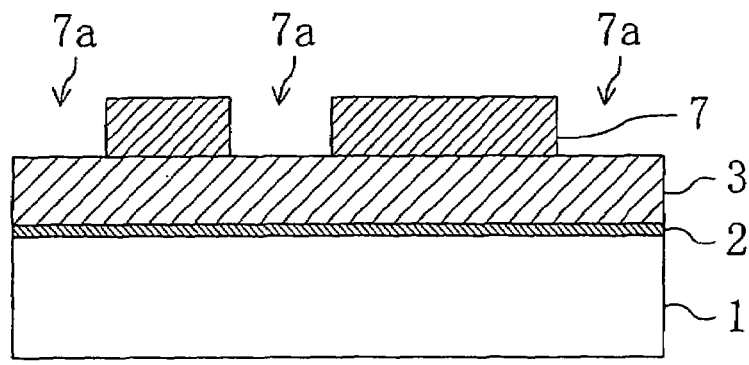
FIG. 9 illustrates a conventional technique for planarizing STIs using a CMP technique.
Figure 9B:
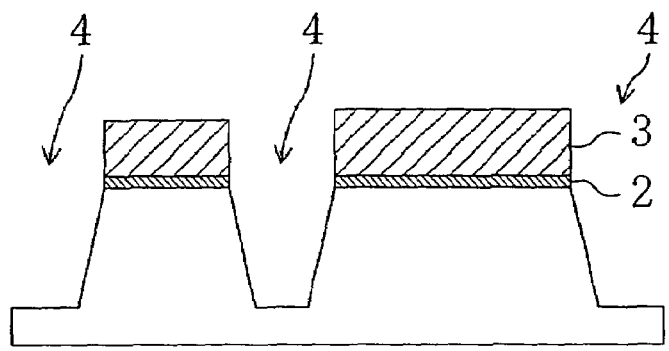
Figure 9C:
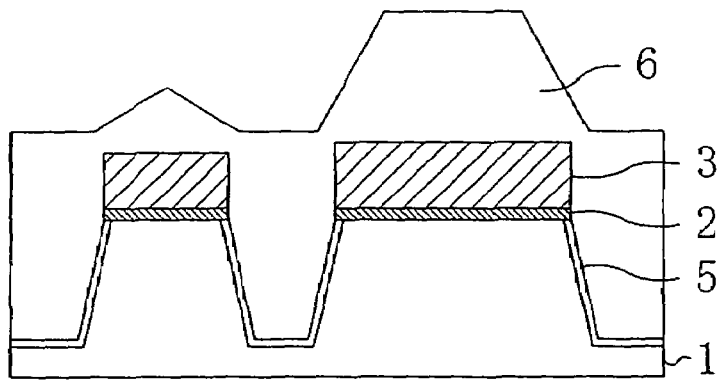
Figure 9D:
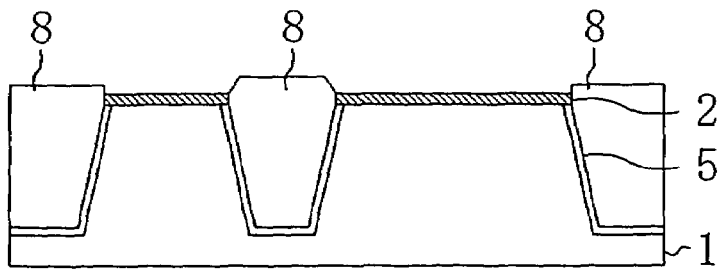

More specifically, a plasma CVD apparatus illustrated in FIG. 6 is used. As shown in FIGS. 7 and 8, by changing a flow rate ratio of TOP gas and Side gas in the plasma CVD apparatus of FIG. 6, a film-thickness distribution of a target film grown on a wafer can be controlled.

In this embodiment, as a means for obtaining an optimum pre-polishing film-thickness distribution of a target film, the method, in which a desired film-thickness distribution is obtained by controlling film-growing conditions, has been described. However, for example, in cases where an etching process is performed after a film-growing process, the desired film-thickness distribution may be achieved by controlling conditions for the etching process. In addition, the optimum pre-polishing film-thickness distribution of the target film may be achieved by controlling treatment conditions in a plurality of process steps before the polishing process. Then, even a film-thickness distribution that cannot be obtained just by controlling the film-growing process step can be achieved as a pre-polishing film-thickness distribution.

Furthermore, it is preferable to use a mirror wafer (a test wafer) as the wafer 111 that is polished by the routine of the initially performed steps St1 through St8 after start-up of the polishing system, on which mirror wafer, no patterns such as wiring are formed but a target film, which is the same as that of an actually used wafer with wiring and other patterns formed thereon, is formed.

Then, the initial data on the polishing-rate distribution established in the polishing system can be updated by the routine of the initially performed steps St1 through St8. Thus, in the wafer 111 polished by the second and subsequent routines, a desired film-thickness distribution can be accurately achieved. Moreover, the actually used wafer with wiring and other patterns formed thereon is not wasted in the first routine.

In particular, in this embodiment, the film-thickness distribution optically obtained by the optical film thickness measurement apparatus 30 is inputted to the computer 20. However, it is preferable that the optical film thickness measurement apparatus 30 be connected with the computer 20 via a network, so that the film-thickness measurement results are automatically transferred to the computer 20 in the steps St5 and St7. This saves the labor required for the input, and in addition prevents human errors such as input errors.

Furthermore, function that is exactly equal to the computers 20 and 21 may be incorporated into a fabrication-line-process management system (for example, CIM). More specifically, the process management system may be connected to the film growing apparatus 11 and the optical film thickness measurement apparatus 30, and a program that realizes function which is exactly the same as the computers 20 and 21 may be added to an operating program of the process management system.

Then, the computers 20 and 21 are not necessary for the control of the polishing and film-growing process steps, allowing a reduction in the cost of setting up the semiconductor fabrication system.

Furthermore, the structure of the semiconductor fabrication system 200 of this embodiment, in which the blocks are connected with each other via the wafer transfer lines 50 so that the process steps of the semiconductor device fabrication method of this embodiment can be simultaneously performed in the respective corresponding blocks, has been described. By this structure, a number of wafers having a desired film thickness distribution can be obtained without decreasing throughput.

Nevertheless, the wafer transferring method, the locations of the blocks, and other respects are not limited to the present invention, so long as a system structure in which the fabrication method of the present invention can be performed is employed. In addition, extra function may be added (for example, a transfer chamber may be prepared, and transfer may be performed between the blocks via the transfer chamber.)

What is claimed is:

1. A method for fabricating a semiconductor device comprising the steps of:
   (a) setting a polishing-rate distribution of a target film formed on a wafer and a desired post-polishing film-thickness distribution of the target film;
   (b) calculating a pre-polishing film-thickness distribution of the target film based on the polishing-rate distribution and the desired film-thickness distribution;
   (c) forming the target film having the pre-polishing film-thickness distribution of the target film; and
   (d) polishing the target film.

2. The method of claim 1, further comprising the steps of:
(e) measuring a film-thickness distribution of the target film formed on the wafer, before the step (d) is performed;
(f) measuring the film-thickness distribution of the target film, after the step (d) is performed; and
(g) updating the polishing-rate distribution based on the film-thickness distribution of the target film obtained in the step (e) and based on the film-thickness distribution of the target film obtained in the step (f), after the step (f) is performed.

3. The method of claim 2, wherein the steps (a) through (g) are repeated.

4. The method of claim 3, wherein a test wafer is used in the initially performed step (a).

5. The method of claim 1, wherein the target film is formed by a plasma CVD process in the step (c).

6. The method of claim 1, further comprising a plurality of steps, before the step (c) is performed.

* * * * *